United States Patent
Bailey

(10) Patent No.: US 6,529,044 B2
(45) Date of Patent: Mar. 4, 2003

(54) CONDITIONAL CLOCK GATE THAT REDUCES DATA DEPENDENT LOADING ON A CLOCK NETWORK

(75) Inventor: Daniel William Bailey, Northboro, MA (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/919,294

(22) Filed: Jul. 31, 2001

(65) Prior Publication Data

US 2003/0025529 A1 Feb. 6, 2003

(51) Int. Cl.[7] .............................................. H03K 19/00
(52) U.S. Cl. .............................. 326/93; 326/95; 326/98; 327/211; 327/212
(58) Field of Search .............................. 326/93, 95, 98; 327/208–212, 214, 215, 224, 225

(56) References Cited

U.S. PATENT DOCUMENTS

| | | | | |
|---|---|---|---|---|
| 5,812,462 A | * | 9/1998 | Merritt | 365/189.05 |
| 5,831,453 A | * | 11/1998 | Stamoulis | 326/113 |
| 6,201,425 B1 | * | 3/2001 | Kartschoke et al. | 327/211 |

OTHER PUBLICATIONS

*Issue in the Design of Domino Logic Circuits*, Pranjal Srivastava et al., Texas Instruments Incorporation (6 p.).

* cited by examiner

*Primary Examiner*—Michael Tokar
*Assistant Examiner*—Vibol Tan
(74) *Attorney, Agent, or Firm*—Conley Rose, P.C.; Michael F. Heim; Jonathan M. Harris

(57) ABSTRACT

A conditional clock gate is implemented that equalizes load conditions on clocked transistor gates to provide a better quality clock signal in a clock distribution network. The conditional clock gate may be implemented as either a NAND gate or a NOR gate. According to one embodiment, a pre-charge transistor is that equals clock loading when the enable signal is de-asserted. The pre-charge transistor charges a terminal of a clocked transistor during certain clock states to mimic load conditions that exist when the enable signal is asserted. In another embodiment, a pre-discharge transistor is implemented that charges a terminal of a clocked transistor during certain clock states to mimic load conditions that exist when the enable signal is asserted. Conditional clock gates may also be implemented with multiple enable inputs using these same prnciples.

51 Claims, 4 Drawing Sheets

CONDITIONAL CLOCK GATE THAT REDUCES DATA DEPENDENT LOADING ON A CLOCK NETWORK

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to clock generation in an integrated circuit. More particularly, the present invention relates to conditional clock gates that are used in integrated circuits to reduce power dissipation. Still more particularly, the present invention relates to a conditional clock gate that more effectively isolates the clock signal from the enable signal to reduce loading.

2. Background of the Invention

One of the critical design elements in modem processor chips and other large scale integrated circuits is the distribution of clock signals within the integrated circuit. Most digital circuits require a clock signal to operate, and data in a digital circuit typically is latched, processed, and output on one or more edges (i.e., the rising edge, the falling edge, or both) of the clock signal. Thus, without a good quality clock signal, most digital circuits will not operate properly, or will operate erratically.

In modem processor designs, and other large scale integrated circuits, the clock signal may be distributed to relatively large areas. To enable the clock signal to be effectively transmitted over long distances, it is common to use a clock distribution network to distribute the clock signal to all digital circuits within the integrated circuit die. The generation and transmission of the clock signal to the various digital circuitry on the die consumes a significant amount of power. In some instances, the integrated circuit may be designed to minimize the amount of power consumed by the integrated circuit during normal operation. As an example, it is desirable to design low power integrated circuits for systems that operate from battery power. Thus, processors intended for use in notebook computers or personal device assistants (PDAs) often are designed to minimize power consumption when the device is in a low power mode.

One common technique to minimize power consumption in integrated circuits is to turn off or disable the clock signal for circuits that are not being used. For example, it may be desirable in a processor to disable the clock signal to certain banks of a data cache if those banks are dormant. Consequently, it has become common to place conditional clock gates in the clock distribution network to enable certain clock branches to be disabled for power conservation.

A conditional clock (which also is referred to as a gated clock) typically is implemented as a two-input NAND gate or NOR gate, where the clock signal comprises one input, and an enable signal comprises the second input. The enable signal thus determines if the clock signal will be passed through the conditional clock gate. Examples of a conditional NAND gate are shown in FIGS. 1A and 1B, and a conditional NOR gate is depicted in FIGS. 2A and 2B. One of the problems with these conditional clock gates is that they introduce some data-dependent loading on the clock network due to the change of state of the enable input signal. This loading on the clock signal can cause jitter (or non-uniformity) in the clock signal. Clock jitter may be manifested by a change in phase, amplitude, or both, of the clock signal. Clock jitter maybe caused by a change in capacitance across clock transistor gates due to a change in state of the enable signal. This problem will be described in more detail by referring to the NAND conditional gate of Figure IA.

When the enable signal in Figure IA is held high (a logical "1"), the enable nFET conducts while the enable pFET is non-conducting. When the clock signal is high (a "1"), the clocked pFET is non-conducting, while the clocked nFET conducts. Because both the enable nFET and the clocked nFET are conducting, the output terminal of the NAND gate is pulled low (i.e., a "0") by $V_{SS}$. As the clock input signal goes low, the clocked nFET becomes non-conducting, while the clocked pFET becomes conducting. This places a charge (i.e., a "1") on the output terminal. During the time that the clock signal is high, the source and drain of the enable pFET are at substantially the same voltage level, and this voltage level changes inversely with the clock signal voltage.

When the enable signal is low (i.e., a "0"), the enable nFET is non-conductive, while the enable pFET conducts. The enable pFET places a charge (i.e., a "1") on the output terminal, producing a continuous high signal at the output of the NAND gate. Even though the output terminal of the NAND gate is driven high while the enable signal is low, the clock signal continues to run, which turns on and off the clocked nFET and clocked pFET gates. In particular, when the clock signal is low, the clocked nFET is non-conducting, while the clocked pFET is conducting. This places a high voltage level on the drain terminal of the non-conducting enable nFET. When the clock transitions to a high voltage level, the clocked pFET becomes non-conducting, while the clocked nFET turns on. The clocked nFET pulls the source of the non-conducting enable pFET low. After the initial clock cycle, and as long as the enable signal remains low, a high voltage level (a "1") is maintained at the drain terminal of the enable nFET, while a low voltage level (a "0") is maintained on the source terminal of the enable pFET. As a result, the clocked nFET will have a low voltage at both its source and drain terminals when the enable signal is low (after the first clock cycle). By comparison, and as noted above, when the enable signal is high, on every other cycle the clocked nFET has a high voltage at its drain terminal. The net effect is that the clocked nFET will have a different load (or a different capacitance between the source and drain terminals) depending on whether the enable signal is high or low.

The different loading on the clocked transistor gates can affect the characteristics of the clock signals that propagate on the clock distribution network, and thus can affect the manner in which the digital circuitry operates. Thus, the varying load encountered by the clock signal due to the varying nature of the enable signal can result in operational abnormalities. As one skilled in the art will appreciate, similar variances in clock load also are present in the NAND conditional clock gate of FIG. 1A, and in the NOR conditional clock gates depicted in FIGS. 2A and 2B.

To minimize clock jitter, it would be advantageous if the clock load (or the capacitance) were more constant, regardless of the state of the enable signal. Maintaining a constant load on the clocked transistor gates would reduce jitter, and thereby improve the quality of the clock signal. Despite the apparent advantages of presenting a constant load to the clocked gates, to date no one has developed a design that solves the problem with loading that results from a change in the state of an enable signal in a conditional clock gate.

BRIEF SUMMARY OF THE INVENTION

The present invention solves the deficiencies of the prior art by implementing a conditional clock gate that minimizes data loading caused by a change in state of the enable signal. According to the preferred embodiment, the conditional clock gate is configured to produce a pre-charge (or pre-discharge) on the transistor stack that is used to implement the NAND or NOR conditional clock gate. This pre-charge (or pre-discharge) produces a uniform load in the transistor stack, which eliminates clock jitter, and produces a better synchronized clock signal.

According to one embodiment of the present invention, a pre-charge transistor is used to charge the drain terminal of a clocked nFET gate when the clock input signal is low, and during periods when an enable signal input is de-asserted. In another embodiment, a pre-discharge transistor may be used to discharge the drain of a clocked pFET gate when the clock signal is high, and during periods when the enable signal is de-asserted. The present invention can also be readily extended to multiple input NAND and NOR gates using the same general principles. The present invention also can be used to discharge the source terminal of a clocked nFET transistor, or to charge the source terminal of a clocked pFET transistor to equal load conditions.

These and other aspects of the present invention will become apparent upon analyzing the drawings, detailed description and claims, which follow.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. The term "stack" or "transistor stack" refers to two or more transistors of the same type that are arranged in a series orientation. The term "asserted" refers to a transition of a signal line from its false or inactive state to its true or active state. The true or active state may be either a high or low voltage state. Similarly, the term "de-asserted" refers to a transition of a signal line from its true or active state to its false or inactive state. The false or inactive state may be either a high or a low voltage state. To the extent that any term is not specially defined in this specification, the intent is that the term is to be given its plain and ordinary meaning.

DETAILED DESCRIPTION OF THE PREFERRED EMBODIMENTS

The present invention solves the problems of the prior art by presenting a more constant load across the Source and Drain terminals of the clocked transistor gates in a conditional NAND or NOR gate, regardless of the state of the enable signal.

Figure 3:
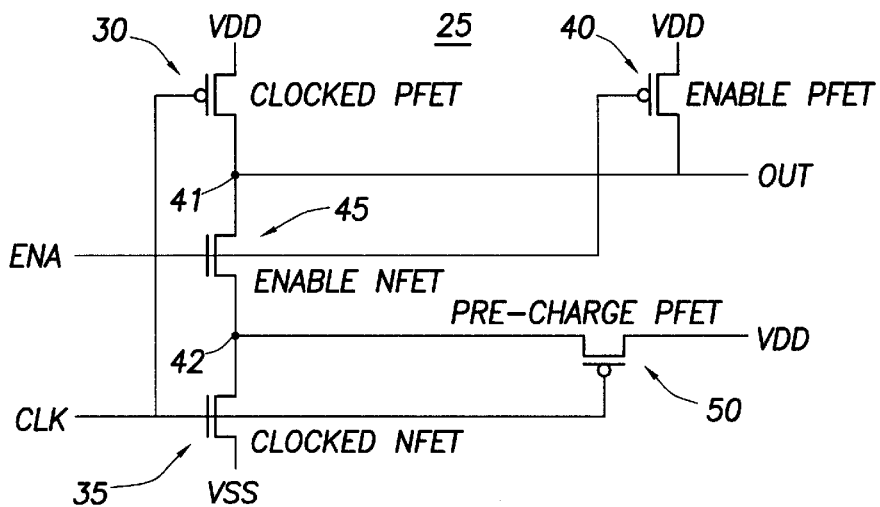
FIG. 3 is a pre-charged two-input NAND clock gate constructed in accordance with the preferred embodiment of the present invention.

Referring now to FIG. 3, a two-input NAND clock gate 25 constructed in accordance with the preferred embodiment generally comprises a clocked pFET transistor 30 and nFET transistor 35, and an enable pFET transistor 40 and nFET transistor 45, with a transistor gate 50 that precharges the drain terminal of the clocked nFET gate 35 to provide a more uniform load on the clocked nFET gate. While the present invention is implemented with field effect transistors (FETs), it should be understood that other transistors and switching devices may be used if desired. In addition, while the following discussion refers to source and drain connections for the FETs, it should be understood that the source and drain terminals of any FET could be reversed without materially affecting the operation of the circuit.

The NAND gate 25 preferably includes an enable (ENA) input, a clock signal (CLK) input, and a clock output (OUT)

terminal. The enable input terminal connects electrically to the gate of the enable nFET 45 and the enable pFET 40. Similarly, the clock input terminal couples to the gate of the clocked nFET 35 and the clocked pFET 30. In addition, the clock input terminal connects to the gate of the pre-charge transistor 50, which preferably comprises a pFET. The source terminal of the clocked pFET 30 and the enable pFET 40 preferably connect to the power supply voltage $V_{DD}$. The drain terminal of the clocked and enable pFETs 30, 40 preferably connect to the output terminal. The source terminal of the clocked nFET 35 preferably connects to the low power supply, $V_{SS}$ (which preferably is at ground). The drain terminal of the clocked nFET 35 connects electrically to the source terminal of the enable nFET 45 at node 42. The drain of the enable nFET connects to the output terminal of NAND gate 25.

According to the preferred embodiment, the pre-charge transistor 50 preferably connects at its source terminal to the power supply voltage $V_{DD}$. The drain terminal of the pre-charge transistor 50 preferably connects electrically to the drain terminal of the clocked nFET 35 and the source terminal of the enable nFET 45 at node 42.

Figure 1A:
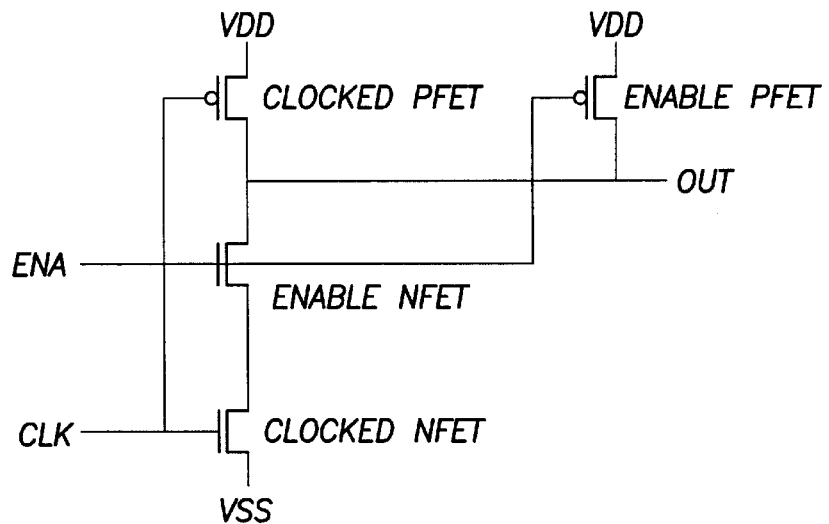
FIG. 1A is an illustration of a prior art two-input NAND clock gate with the clock terminal at the bottom of a transistor stack.
Figure 1B:
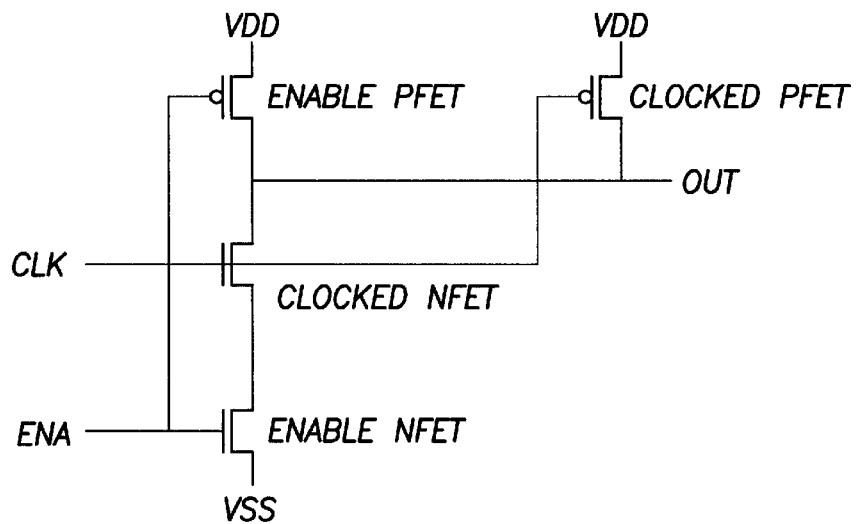
FIG. 1B is an illustration of a prior art two-input NAND clock gate with the clock terminal at the top of the stack.
Figure 2A:
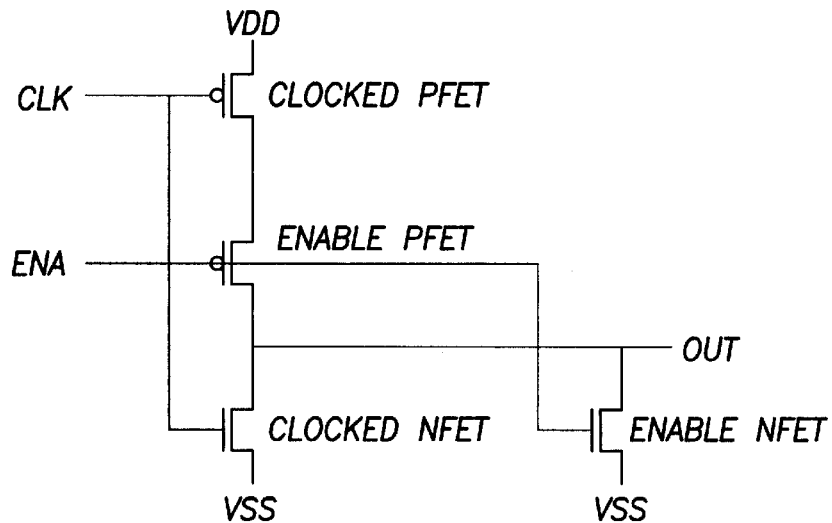
FIG. 2A is an illustration of a prior art two-input NOR clock gate with the clock terminal at the bottom of a transistor stack.
Figure 2B:
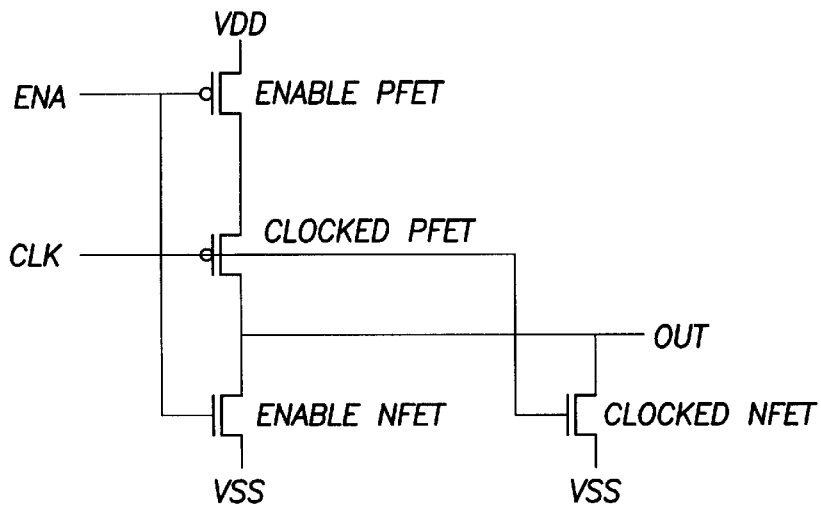
FIG. 2B is an illustration of a prior art two-input NOR clock gate with the clock terminal at the top of the stack.

Referring still to FIG. 3, the operation of NAND gate 25 will now be described. As explained above in conjunction with FIG. 1A, when the enable signal is high, enable nFET 45 conducts. When the clock input signal goes low, the clocked pFET turns on, thereby pulling node 41 high, and producing a logic "1" at the output terminal of NAND gate 25. Because the enable nFET 45 is conducting, node 42 is at substantially the same voltage as node 41. When the clock input signal goes high, the clocked pFET 30 turns off, and the clocked nFET conducts, thereby pulling node 42 low. Because the enable nFET 45 is on, node 42 pulls node 41 low, thereby placing a logic "0" at the NAND output terminal. When the enable signal goes low, the enable nFET 45 turns off, and the enable pFET turns on, thereby placing a high voltage signal on the output terminal of the NAND gate, and pulling node 41 high.

The pre-charge transistor 50 charges up node 42 when the clock input signal is low, even in the event that the enable nFET gate is non-conducting. Thus, when the clock input signal is low, pre-charge transistor 50 conducts, raising node 42 to the power supply voltage a "1"). This charging of node 42 occurs even though the enable signal is low (a "0"), and enable nFET 45 is non-conducting. When the clock input signal goes high, the pre-charge transistor 50 shuts off, and clocked nFET 35 turns on, thereby pulling node 42 low (a "0"). Thus, the pre-charge pFET 50 operates to charge the node 42 when the clock is low, thereby placing a high voltage at node 42 when the clock is low. This operation therefore mimics the voltage swings that appear at node 42 when the enable signal is high, as explained above. Thus, when the clock input signal is low, node 42 is charged to a high voltage level, and when the clock signal is high, node 42 is pulled low. By pre-charging the drain of the clocked nFET 35 during the low cycles of the clock input signal, the pre-charge transistor 50 produces a load pattern on the clocked nFET 35 that is substantially the same as that which the nFET 35 experiences when the enable signal is asserted high. Consequently, the load is uniform, thereby producing a more uniform clock signal in the clock distribution network. It should be noted that the pre-charge transistor 50 may be configured as a relatively small gain device because the output of the transistor 50 simply charges node 42, and is not used to drive the clock output terminal. This same principle also applies equally to the following alternative designs.

Figure 4:
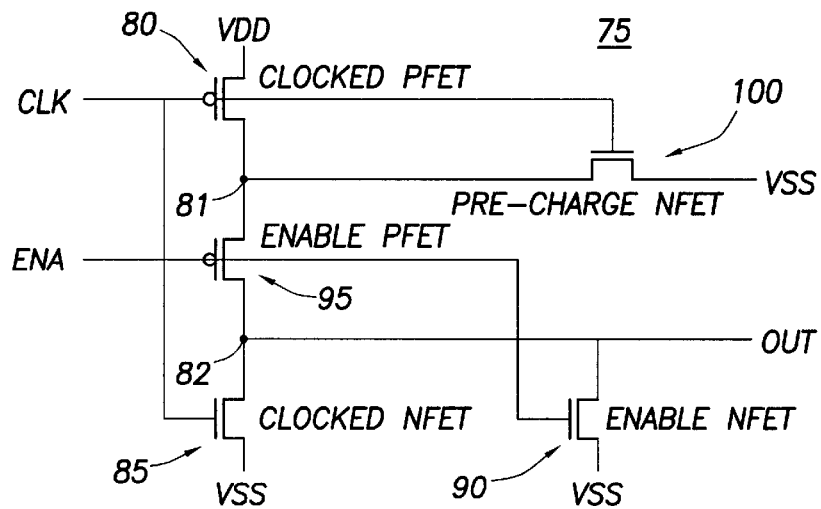
FIG. 4 is a pre-discharged two-input NOR clock gate constructed in accordance with the preferred embodiment.

The same principle may also be applied to other conditional logic gates. Thus, for example, a pre-discharge transistor 100 may be added to a standard two input NOR gate to reduce loading effects caused by the enable signal. Referring now to FIG. 4, a two input NOR gate 75 preferably comprises a clocked nFET gate 85, a clocked pFET gate 80, an enable nFET 90, an enable pFET 95, and a pre-discharge transistor 100. In accordance with normal convention, the NOR gate 75 includes a clock input (CLK) terminal, an enable (ENA) terminal, and a clock output (OUT) terminal.

The clock input terminal connects electrically to the gate of the clocked pFET gate 80 and the clocked nFET gate 85, to turn these gates on and off as the clock signal changes state. The source terminal of the clocked pFET gate 80 connects to the power supply voltage $V_{DD}$, while the source terminal of the clocked nFET gate connects to low power supply (or ground), $V_{SS}$. The drain terminal of the clocked pFET gate 80 connects to the source terminal of the enable pFET 95 at node 81. The drain terminal of the clocked nFET gate 85 connects to the drain terminal of the enable pFET gate 95 at node 82. Node 82 connects electrically to the output terminal (OUT) of the NOR gate 75. The gate of the enable pFET 95 and enable nFET 90 receive the enable signal, which controls the operation of these gates. As noted above, the source terminal of the enable pFET 95 connects to the drain terminal of the clocked pFET 80 at node 81, and the drain terminal of the enable pFET 95 connects to the drain terminal of the clocked nFET 85 at node 82. The source terminal of the enable nFET 90 connects to the low power supply voltage $V_{SS}$, and the drain terminal connects to the output terminal.

Referring still to FIG. 4, the pre-discharge transistor 100 preferably comprises an nFET gate that receives the clock signal at its gate terminal. The source of the pre-discharge nFET 100 connects electrically to the low power supply $V_{SS}$. The drain terminal of the pre-discharge nFET 100 connects to the drain terminal of the clocked pFET 80 and the source terminal of the enable pFET 95 at node 81. The pre-discharge transistor 100 operates to pre-discharge node 81 when the clock signal is high, as the following discussion will illustrate.

When the enable signal is low, enable pFET 95 turns on, thereby causing current to flow between the source and drain terminals. When the clock input signal is high, clocked nFET gate 85 conducts, thus pulling node 82 low (a "0"), and placing a logic "0" at the output terminal of the NOR gate 75. When the clock input signal goes low, clocked pFET 80 conducts, charging node 81 to a high voltage (a "1"). When the enable pFET is conducting (that is, when the enable signal is low), node 82 also charges to a high voltage, thus placing a logic "1" on the output terminal of the NOR gate 75. Thus, when the enable signal is low (and enable pFET 95 is on), node 81 is low during high input clock pulses, and high during low input clock pulses.

When the enable signal goes high, enable pFET 95 turns off, and enable nFET 90 turns on. This causes the output terminal (OUT) of the NOR gate 75 to be pulled low, regardless of the state of the clock input signal. The clock input signal, however, continues to cycle between high and low voltage levels. When the clock input signal is high, clocked nFET gate 85 conducts, thus pulling node 82 low through transistor gates 85 and 90. In addition, when the input clock signal is high, transistor gate 100 also conducts, thus pulling node 81 low as well. Thus, transistor gate 100 discharges any voltage that would otherwise exist at node 81 during the time that the enable pFET 95 is turned off. When the clock input signal goes high, transistor gate 100 turns off, and clocked pFET gate 80 turns on, thereby charging node 81. On the subsequent clock cycle, node 81 is again discharged by transistor gate 100.

Thus, transistor gate 100 operates to discharge the voltage on node 81 when the clock signal is high, even though the enable pFET gate 95 is off (and thus enable signal is high). This operation mimics the load pattern that appears on the clocked pFET gate when the enable signal is low, thereby minimizing the effects of loading on the clock input signal.

Figure 5:
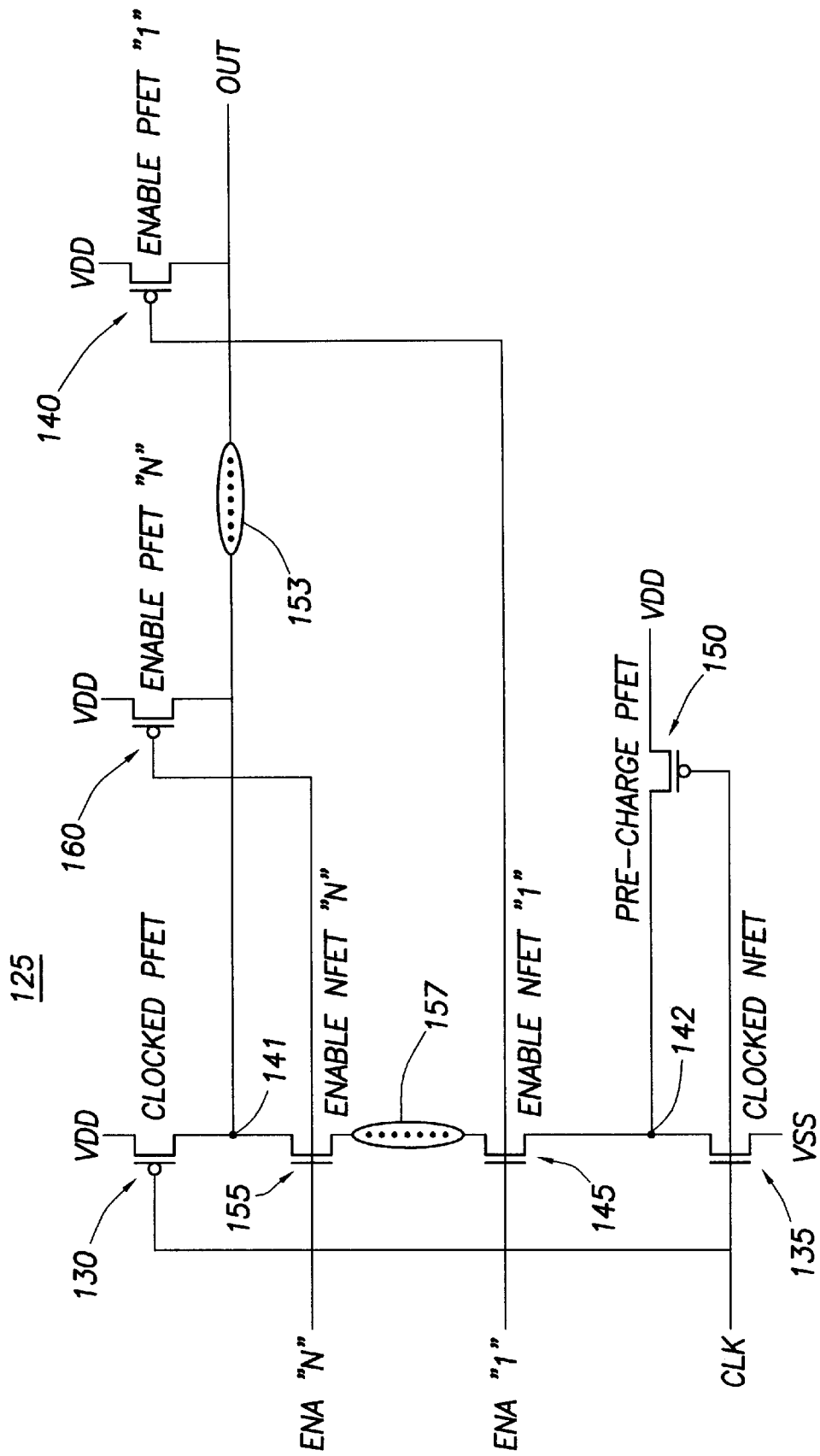
FIG. 5 is a pre-charged n-input NAND clock gate constructed in accordance with the principles of the present invention.

The principles of the present invention can be extended to NAND and NOR gates that have more than two inputs. Referring now to FIG. 5, a NAND conditional clock gate 125 is shown that includes N input signals. According to the preferred embodiment, the clocked transistor gates 130 (pFET) and 135 (nFET) are placed adjacent the power rails ($V_{DD}$ and $V_{SS}$). In addition to the clocked transistor gates 130, 135, 2N enable gates are provided (N enable pFET gates plus N enable nFET gates). In FIG. 5, a first enable signal (ENA "1") is shown connected to the gate of a first enable nFET 145, together with an Nth enable signal (ENA "N") connected to the gate of an Nth enable nFET gate 155. The discontinuity represented by the dashed line 157 represents that other intermediate enable signals may also be provided connected to other enable nFET gates in a similar manner. Similarly, the first enable signal also connects to the gate of a first enable pFET 140, while the Nth enable signal connects to the gate of the Nth enable pFET gate 160. Other intermediate enable pFET gates would be provided for each intermediate enable signal, as represented by the dashed lines 153.

The three or more input NAND gate 125 operates in a manner similar to the NAND gate 25 in FIG. 3. If all the enable input signals are high, the NAND gate 125 operates to invert the clock input signal. If any of the enable input signals are low, then its associated nFET gate turns off, and its associated pFET gate turns on, thus placing a continuous high output (a "1") on the output terminal of the NAND gate 125. In the event that any of the enable input signals goes low, the pre-charge transistor 150 operates to charge node 142 when the clock signal is low, thereby mimicking the load pattern that appears at node 142 when all enable signals are high.

Figure 6:
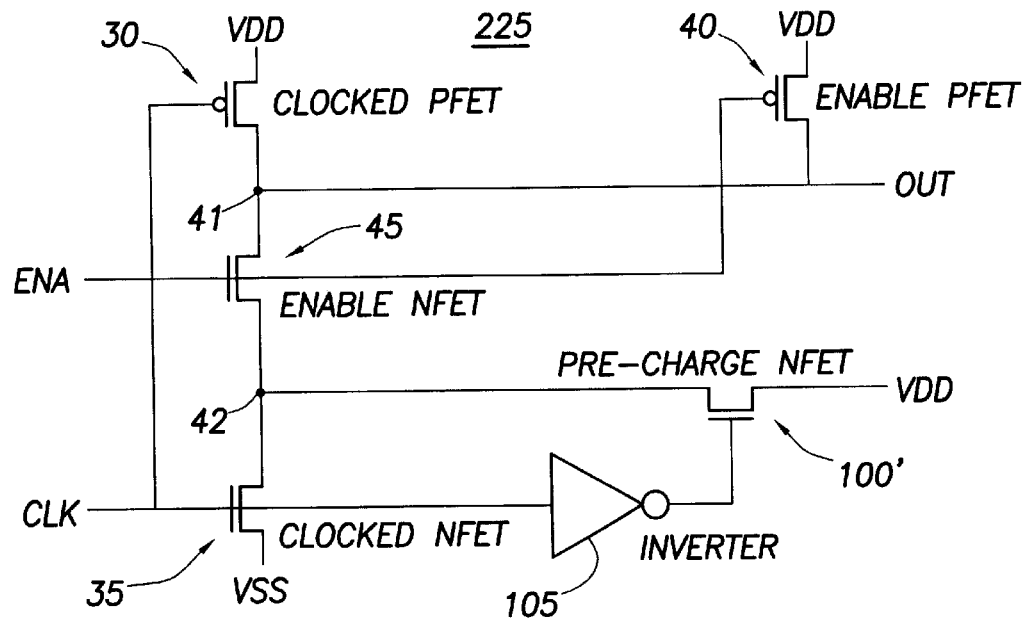
FIG. 6 is a pre-charged two-input NAND clock gate using inverted clock and nFET pull-up.

Referring now to FIG. 6, a two-input NAND conditional clock gate 225 is shown according to an alternative embodiment of the present invention. The NAND gate 225 is very similar to NAND gate 25 of FIG. 3, except an nFET is used as the pre-charge transistor 100', in combination with an inverter 105. The operation of the NAND gate 225 of FIG. 6 is substantially the same as the operation of the NAND gate 25 of FIG. 3. Thus, the other components of FIG. 6 preferably are constructed identically to the circuit of FIG. 3, as denoted by the use of the same reference numerals in FIGS. 3 and 6 for those components that are identical.

Figure 7:
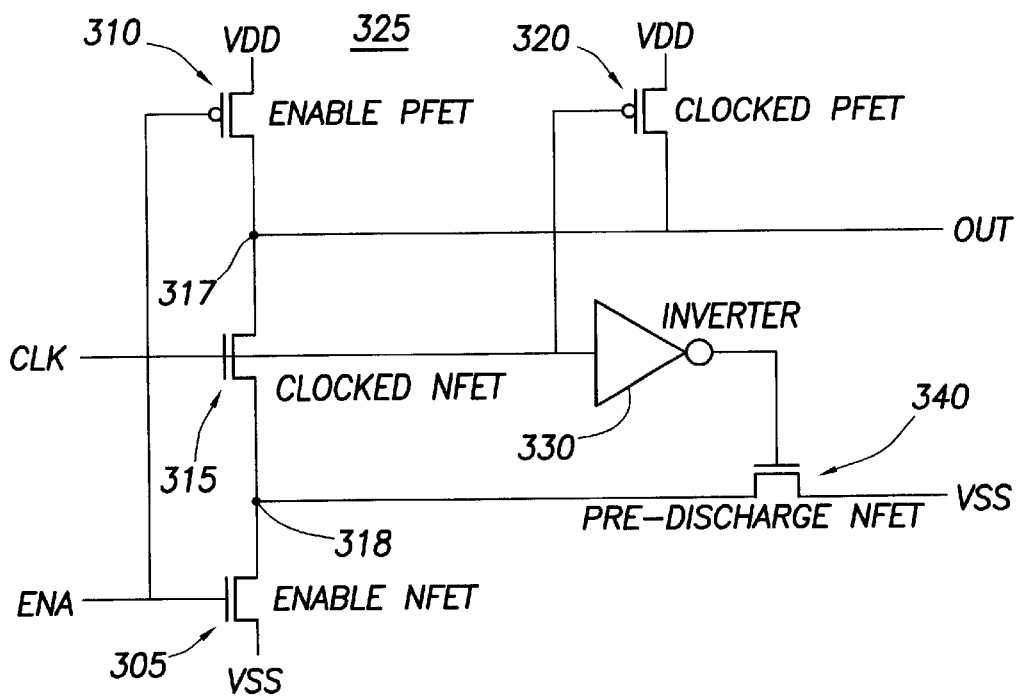
FIG. 7 is a pre-discharged two-input NAND clock gate with clock at the top of the transistor stack.

As yet another alternative implementation, FIG. 7 depicts a two-input NAND conditional clock gate 325 in which the clock input terminal is placed at the top of the transistor stack. This design may be used in certain technologies to make the NAND gate operate faster. As shown in FIG. 7, an enable nFET 305 and an enable pFET 310 receive the enable input signal at their respective gate terminals. The source terminal of the enable pFET 310 connects to the power supply voltage $V_{DD}$, while the drain terminal of enable pFET gate 310 connects to the drain terminal of a clocked nFET gate 315 at node 317. Node 317 connects to the output terminal of NAND gate 325, and thus is at the same voltage potential as the output terminal. The source of the enable nFET 305 connects to ground ($V_{SS}$), and the drain terminal connects to the source terminal of the clocked nFET 315 at node 318. The clocked nFET 315 and clocked pFET gates 320 connect at their gate terminals to the clock input signal. The clocked nFET 315 connects at its source terminal to node 318, and its drain terminal connects to node 317. The source terminal of the clocked pFET 320 connects to the power supply voltage $V_{DD}$, while the drain terminal connects to the clock output terminal.

Referring still to FIG. 7, the conditional NAND gate 325 also includes a pre-discharge transistor 340 and an inverter gate 330. The transistor 340 preferably is constructed as an nFET. The input terminal of the inverter gate 330 connects to the clock input terminal, while the output terminal of the inverter 330 connects to the gate of the pre-discharge nFET 340. The source of the pre-discharge nFET connects to ground ($V_{SS}$), and the drain terminal connects to the source terminal of the clocked nFET 315 at node 318.

When the enable signal is high, enable pFET 310 turns off, and enable nFET 305 conducts, thus pulling node 318 low. On positive clock cycles, clocked nFET gate 315 conducts, thus pulling node 317, and placing a logic "0" on the output terminal of NAND gate 325. When the clock signal goes low, clocked nFET gate 315 turns off, and clocked pFET gate 320 turns on, charging the output terminal of the NAND gate 325 (providing a logic "1" ay the output terminal). Thus, when the enable signal is high, NAND gate 325 inverts the input clock signal.

When the enable signal is low, enable nFET 305 turns off, and enable pFET 310 turns on, thus pulling node 317 high, and producing a high voltage (a "1") on the output terminal of the NAND gate 325. Although the output terminal remains high, the clock input signal continues to cycle. When the clock input signal is high, clocked nFET 315 conducts, causing node 318 to charge. When the clock input signal is high, the clocked pFET 320 is non-conductive. Similarly, when the clock input signal is high, the output of inverter 330 is low, thus rendering pre-discharge nFET 340 non-conductive. When the clock signal goes low, clocked nFET gate 325 turns off, and clocked pFET gate 320 turns on, further pulling the output terminal (and node 317) high. Also, when the clock signal goes high, pre-discharge nFET 340 turns on, which pulls node 318 low. Thus, pre-discharge transistor 340 and inverter 330 operate to discharge node 318 whenever the clock signal is low. Node 318 then charges when the clock signal goes high.

By pre-charging the source terminal of the clocked nFET 35 during the low cycles of the clock input signal, the pre-charge transistor 340 produces a load pattern on the clocked nFET 315 that is substantially the same as that which the nFET 315 experiences when the enable signal is asserted high. Consequently, the load is uniform, thereby producing a more uniform clock signal in the clock distribution network.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

I claim:

1. A conditional clock gate, comprising:
    a clock input terminal that receives a clock input signal;
    a clock output terminal;
    an enable input terminal that receives an enable input signal;
    first and second clocking transistors coupled to the clock input terminal, said first and second clocking transistor operating in response to the clock input signal to generate an inverted clock signal;
    first and second enable transistors coupled to the enable input terminal, said first and second enable transistors operating in response to the enable input signal to pass the inverted clock signal to the clock output terminal when the enable input signal is asserted, and to generate a constant output signal at the clock output signal when the enable input signal is de-asserted; and
    a pre-charge transistor coupled to a terminal of said first clocking transistor or said second clocking transistor, said pre-charge transistor operating to mimic load conditions that exist at the terminal when said enable input signal is asserted.

2. The conditional clock gate of claim 1, wherein the first clocking transistor comprises an n-junction field effect transistor (nFET) and the second clocking transistor comprises a p-junction field effect transistor (pFET).

3. A conditional clock gate, comprising:
    a clock input terminal that receives a clock input signal;
    a clock output terminal;
    an enable input terminal that receives an enable input signal;
    first and second clocking transistors coupled to the clock input terminal, said first and second clocking transistor operating in response to the clock input signal to generate an inverted clock signal, wherein the first clocking transistor comprises an n-junction field effect transistor (nFET) and the second clocking transistor comprises a p-junction field effect transistor (pFET)
    first and second enable transistors coupled to the enable input terminal, said first and second enable transistors operating in response to the enable input signal to pass the inverted clock signal to the clock output terminal when the enable input signal is asserted, and to generate a constant output signal at the clock output signal when the enable input signal is de-asserted; and
    a pre-charge transistor coupled to a terminal of said first clocking transistor or said second clocking transistor, said pre-charge transistor operating to mimic load conditions that exist at the terminal when said enable input signal is asserted;
    wherein the nFET clocking transistor includes:
        a gate terminal connected to the clock input terminal;
        a source terminal connected to a low voltage power supply; and
        a drain terminal connected to the pre-charge transistor.

4. The conditional clock gate of claim 3, wherein the drain terminal of the nFET clocking transistor also connects to a terminal of one of said first and second enable transistors.

5. The conditional clock gate of claim 3, wherein the pre-charge transistor comprises a field effect transistor (FET) that includes a source terminal connected to a high voltage power supply and a drain terminal connected to the drain terminal of the nFET clocking transistor.

6. The conditional clock gate of claim 5, wherein the pre-charge FET transistor includes a gate terminal that couples to the clock input terminal.

7. The conditional clock gate of claim 6, wherein the pre-charge FET transistor charges the drain of the nFET clocking transistor when the pre-charge FET transistor is turned on by the clocking input signal.

8. The conditional clock gate of claim 7, wherein the pre-charge FET transistor comprises a pFET that charges the drain of the nFET clocking transistor when the clock input signal is low.

9. The conditional clock gate of claim 7, wherein the pre-charge FET transistor comprises an nFET.

10. The conditional clock gate of claim 9, wherein the pre-charge nFET transistor couples to the clock input terminal via an inverter, and wherein the pre-charge nFET charges the drain of the nFET clocking transistor when the clock input signal is low.

11. The conditional clock gate of claim 3, wherein the first enable transistor comprises an n-junction field effect transistor (nFET), and the second enable transistor comprises a p-junction field effect transistor (pFET).

12. The conditional clock gate of claim 11, wherein the pre-charge transistor connects to the drain terminal of the nFET clocking transistor and to the source terminal of the nFET enable transistor.

13. The conditional clock gate of claim 12, wherein the nFET enable transistor connects between the nFET clocking transistor and the pFET clocking transistor, and the nFET enable transistor turns off when the enable input signal is de-asserted as a low voltage signal.

14. The conditional clock gate of claim 3, wherein the conditional clock gate operates as a NAND gate.

15. The conditional clock gate of claim 3, wherein the low voltage power supply is ground.

16. The clock driver of claim 11, wherein the pFET clocking transistor and the pFET enable transistor each includes a drain terminal connected to the output clock terminal.

17. The conditional clock gate of claim 2, wherein the nFET clocking transistor includes:
    a gate terminal connected to the clock input terminal;
    a source terminal connected to a low voltage power supply; and a drain terminal connected to said output clock terminal.

18. A conditional clock gate, comprising:
a clock input terminal that receives a clock input signal;
a clock output terminal;
an enable input terminal that receives an enable input signal;
first and second clocking transistors coupled to the clock input terminal, said first and second clocking transistor operating in response to the clock input signal to generate an inverted clock signal, wherein the first clocking transistor comprises an n-junction field effect transistor (nFET) and the second clocking transistor comprises a p-junction field effect transistor (pFET)
first and second enable transistors coupled to the enable input terminal, said first and second enable transistors operating in response to the enable input signal to pass the inverted clock signal to the clock output terminal when the enable input signal is asserted, and to generate a constant output signal at the clock output signal when the enable input signal is de-asserted; and
a pre-charge transistor coupled to a terminal of said first clocking transistor or said second clocking transistor, said pre-charge transistor operating to mimic load conditions that exist at the terminal when said enable input signal is asserted;
wherein the pFET clocking transistor includes:
a gate terminal connected to the clock input terminal;
a source terminal connected to a high voltage power supply; and
a drain terminal connected to the pre-charge transistor.

19. The conditional clock gate of claim 18, wherein the drain terminal of the pFET clocking transistor also connects to a terminal of said first enable transistor.

20. The conditional clock gate of claim 18, wherein the pre-charge transistor comprises a field effect transistor (FET) that includes a source terminal connected to a low voltage power supply and a drain terminal connected to the drain terminal of the pFET clocking transistor.

21. The conditional clock gate of claim 20, wherein the pre-charge FET transistor includes a gate terminal that couples to the clock input terminal.

22. The conditional clock gate of claim 21, wherein the pre-charge FET transistor discharges the drain of the pFET clocking transistor when turned on by the clocking input signal.

23. The conditional clock gate of claim 22, wherein the pre-charge FET transistor comprises an nFET that discharges the drain of the pFET clocking transistor when the clock input signal is high.

24. The conditional clock gate of claim 19, wherein the first enable transistor comprises a p-junction field effect transistor (pFET), and the second enable transistor comprises an n-junction field effect transistor (nFET).

25. The conditional clock gate of claim 20, wherein the pre-charge transistor connects to the drain terminal of the pFET clocking transistor and to the source terminal of the pFET enable transistor.

26. The conditional clock gate of claim 25, wherein the pFET enable transistor connects between the nFET clocking transistor and the pFET clocking transistor, and the pFET enable transistor turns off when the enable input signal is de-asserted as a high voltage signal.

27. The conditional clock gate of claim 18, wherein the conditional clock gate operates as a NOR gate.

28. A conditional clock gate, comprising:
a clock input terminal that receives a clock input signal;
a clock output terminal;
an enable input terminal that receives an enable input signal;
at least one clocking transistor coupled to the clock input terminal, said at least one clocking transistor operating in response to the clock input signal to generate an inverted clock signal;
at least one enable transistor coupled to the enable input terminal, said at least one enable transistor operating in response to the enable input signal to pass the inverted clock signal to the clock output terminal when the enable input signal is asserted, and to generate a constant output signal at the clock output signal when the enable input signal is de-asserted; and
a pre-charge transistor coupled to a terminal of said clocking transistor, said pre-charge transistor operating to mimic load conditions that exist at the terminal when said enable input signal is asserted.

29. A NAND conditional clock gate, comprising:
a clock input terminal that receives a clock input signal;
a clock output terminal;
an enable input terminal that receives an enable input signal;
a pFET clocking transistor and an nFET clocking transistor connected to the clock input terminal, said pFET clocking transistor and said nFET clocking transistor operating in response to the clock input signal to generate an inverted clock signal;
a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and
a pre-charge transistor coupled to a drain terminal of said nFET clocking transistor, said pre-charge transistor operating to mimic load conditions that exist at the drain terminal when said enable input signal is asserted high.

30. A NAND conditional clock gate, comprising:
a clock input terminal that receives a clock input signal;
a clock output terminal;
an enable input terminal that receives an enable input signal;
a pFET clocking transistor and an nFET clocking transistor connected to the clock input terminal, said pFET clocking transistor and said nFET clocking transistor operating in response to the clock input signal to generate an inverted clock signal;
a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and
a pre-charge transistor coupled to a drain terminal of said nFET clocking transistor, said pre-charge transistor operating to mimic load conditions that exist at the drain terminal when said enable input signal is asserted high;

wherein the nFET clocking transistor also includes:
  a gate terminal connected to the clock input terminal; and
  a source terminal connected to a low voltage power supply.

31. The NAND conditional clock gate of claim 30, wherein the drain terminal of the nFET clocking transistor also connects to a drain terminal of said nFET enable transistor.

32. A NAND conditional clock gate, comprising:
  a clock input terminal that receives a clock input signal;
  a clock output terminal;
  an enable input terminal that receives an enable input signal;
  a pFET clocking transistor and an nFET clocking transistor connected to the clock input terminal, said pFET clocking transistor and said nFET clocking transistor operating in response to the clock input signal to generate an inverted clock signal;
  a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and
  a pre-charge transistor coupled to a drain terminal of said nFET clocking transistor, said pre-charge transistor operating to mimic load conditions that exist at the drain terminal when said enable input signal is asserted high;
  wherein the pre-charge transistor comprises a field effect transistor (FET) that includes a source terminal connected to a high voltage power supply and a drain terminal connected to the drain terminal of the nFET clocking transistor.

33. The NAND conditional clock gate of claim 32, wherein the pre-charge FET transistor includes a gate terminal that couples to the clock input terminal.

34. The NAND conditional clock gate of claim 33, wherein the pre-charge FET transistor charges the drain terminal of the nFET clocking transistor when turned on by the clocking input signal.

35. The NAND conditional clock gate of claim 34, wherein the pre-charge FET transistor comprises a pFET that charges the drain of the nFET clocking transistor when the clock input signal is low.

36. The NAND conditional clock gate of claim 34, wherein the pre-charge FET transistor comprises an nFET.

37. The NAND conditional clock gate of claim 36, wherein the pre-charge nFET transistor couples to the clock input terminal via an inverter, and wherein the pre-charge nFET charges the drain of the nFET clocking transistor when the clock input signal is low.

38. A NAND conditional clock gate, comprising:
  a clock input terminal that receives a clock input signal;
  a clock output terminal;
  an enable input terminal that receives an enable input signal;
  a pFET clocking transistor and an nFET clocking transistor connected to the clock input terminal, said pFET clocking transistor and said nFET clocking transistor operating in response to the clock input signal to generate an inverted clock signal;
  a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and
  a pre-charge transistor coupled to a drain terminal of said nFET clocking transistor, said pre-charge transistor operating to mimic load conditions that exist at the drain terminal when said enable input signal is asserted high;
  wherein the nFET enable transistor connects between the nFET clocking transistor and the pFET clocking transistor, and the nFET enable transistor turns off when the enable input signal is de-asserted as a low voltage signal.

39. A NAND conditional clock gate, comprising:
  a clock input terminal that receives a clock input signal;
  a clock output terminal;
  an enable input terminal that receives an enable input signal;
  a pFET clocking transistor and an nFET clocking transistor connected to the clock input terminal, said pFET clocking transistor and said nFET clocking transistor operating in response to the clock input signal to generate an inverted clock signal;
  a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and
  a pre-charge transistor coupled to a drain terminal of said nFET clocking transistor, said pre-charge transistor operating to mimic load conditions that exist at the drain terminal when said enable input signal is asserted high;
  wherein the pFET clocking transistor and the pFET enable transistor each include a drain terminal connected to the output clock terminal.

40. A NAND conditional clock gate, comprising:
  a clock input terminal that receives a clock input signal;
  a clock output terminal;
  an enable input terminal that receives an enable input signal;
  a pFET clocking transistor and an nFET clocking transistor connected to the clock input terminal, said pFET clocking transistor and said nFET clocking transistor operating in response to the clock input signal to generate an inverted clock signal;
  a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and a pre-charge transistor coupled to a drain terminal of said nFET clocking transistor, said pre-charge transistor operating to mimic load conditions that exist at the drain terminal when said enable input signal is asserted high;

wherein the pFET clocking transistor and the pFET enable transistor each include a drain terminal connected to the output clock terminal.

41. A NAND conditional clock gate, comprising:

a clock input terminal that receives a clock input signal;

a clock output terminal;

an enable input terminal that receives an enable input signal;

a pFET clocking transistor and an nFET clocking transistor connected to the clock input terminal, said pFET clocking transistor and said nFET clocking transistor operating in response to the clock input signal to generate an inverted clock signal;

a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and a pre-charge transistor coupled to a drain terminal of said nFET clocking transistor, said pre-charge transistor operating to mimic load conditions that exist at the drain terminal when said enable input signal is asserted high;

wherein the enable input signal is asserted high and de-asserted low.

42. A NOR conditional clock gate, comprising:

a clock input terminal that receives a clock input signal;

a clock output terminal;

an enable input terminal that receives an enable input signal;

a pFET clocking transistor and an nFET clocking transistor connected to the clock input terminal, said pFET clocking transistor and said nFET clocking transistor operating in response to the clock input signal to generate an inverted clock signal;

a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and a pre-discharge transistor coupled to a drain terminal of said nFET clocking transistor, said pre-charge transistor operating to mimic load conditions that exist at the drain terminal when said enable input signal is asserted high.

43. A NOR conditional clock gate, comprising:

a clock input terminal that receives a clock input signal;

a clock output terminal;

an enable input terminal that receives an enable input signal;

a pFET clocking transistor and an nFET clocking transistor connected to the clock input terminal, said pFET clocking transistor and said nFET clocking transistor operating in response to the clock input signal to generate an inverted clock signal;

a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and a pre-discharge transistor coupled to a drain terminal of said nFET clocking transistor, said pre-charge transistor operating to mimic load conditions that exist at the drain terminal when said enable input signal is asserted high;

wherein the enable input signal is asserted low and de-asserted high.

44. A NOR conditional clock gate, comprising:

a clock input terminal that receives a clock input signal;

a clock output terminal;

an enable input terminal that receives an enable input signal;

a pFET clocking transistor and an nFET clocking transistor connected to the clock input terminal, said pFET clocking transistor and said nFET clocking transistor operating in response to the clock input signal to generate an inverted clock signal;

a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and a pre-discharge transistor coupled to a drain terminal of said nFET clocking transistor, said pre-charge transistor operating to mimic load conditions that exist at the drain terminal when said enable input signal is asserted high;

wherein the nFET clocking transistor includes:
a gate terminal connected to the clock input terminal;
a source terminal connected to a low voltage power supply, and
a drain terminal connected to said output clock terminal.

45. A NOR conditional clock gate, comprising:

a clock input terminal that receives a clock input signal;

a clock output terminal;

an enable input terminal that receives an enable input signal;

a pFET clocking transistor and an nFET clocking transistor connected to the clock input terminal, said pFET clocking transistor and said nFET clocking transistor operating in response to the clock input signal to generate an inverted clock signal;

a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and a pre-discharge transistor coupled to a drain terminal of said nFET clocking transistor, said pre-charge transistor operating to mimic load conditions that exist at the drain terminal when said enable input signal is asserted high;

wherein the pFET clocking transistor includes:
a gate terminal connected to the clock input terminal;
a source terminal connected to a high voltage power supply; and
a drain terminal connected to the pre-discharge transistor.

46. The NOR conditional clock gate of claim 45, wherein the drain terminal of the pFET clocking transistor also connects to a terminal of said pFET enable transistor.

47. The NOR conditional clock gate of claim 46, wherein the pre-discharge transistor comprises a field effect transistor (FET) that includes a source terminal connected to a low voltage power supply and a drain terminal connected to the drain terminal of the pFET clocking transistor.

48. The NOR conditional clock gate of claim 47, wherein the pre-discharge FET transistor includes a gate terminal that couples to the clock input terminal.

49. The NOR conditional clock gate of claim 48, wherein the pre-discharge FET transistor discharges the drain of the pFET clocking transistor when turned on by the clocking input signal.

50. The NOR conditional clock gate of claim 49, wherein the pre-discharge FET transistor comprises an nFET that discharges the drain terminal of the pFET clocking transistor when the clock input signal is high.

51. A NOR conditional clock gate, comprising:

a clock input terminal that receives a clock input signal;

a clock output terminal;

an enable input terminal that receives an enable input signal;

a pFET clocking transistor and an nFET clocking transistor connected to the clock input terminal, said pFET clocking transistor and said nFET clocking transistor operating in response to the clock input signal to generate an inverted clock signal;

a pFET enable transistor and an nFET enable transistor coupled to the enable input terminal, said pFET enable transistor and said nFET enable transistor operating in response to the enable input signal to pass the inverted clock signal to the clock output terminal when the enable input signal is asserted, and to generate a constant output signal at the clock output signal when the enable input signal is de-asserted; and a pre-discharge transistor coupled to a drain terminal of said nFET clocking transistor, said pre-charge transistor operating to mimic load conditions that exist at the drain terminal when said enable input signal is asserted high;

wherein the pFET enable transistor connects between the nFET clocking transistor and the pFET clocking transistor, and the pFET enable transistor turns off when the enable input signal is de-asserted as a high voltage signal.

* * * * *